United States Patent
Tseng et al.

(10) Patent No.: US 11,069,853 B2
(45) Date of Patent: Jul. 20, 2021

(54) METHODS FOR FORMING STRUCTURES FOR MRAM APPLICATIONS

(71) Applicant: Applied Materials, Inc., Santa Clara, CA (US)

(72) Inventors: Hsin-Wei Tseng, San Jose, CA (US); Chando Park, Palo Alto, CA (US); Jaesoo Ahn, San Jose, CA (US); Lin Xue, San Jose, CA (US); Mahendra Pakala, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/195,313

(22) Filed: Nov. 19, 2018

(65) Prior Publication Data

US 2020/0161541 A1    May 21, 2020

(51) Int. Cl.
| | | |
|---|---|---|
| H01L 27/22 | (2006.01) | |
| H01L 43/12 | (2006.01) | |
| H01L 43/02 | (2006.01) | |
| H01L 43/10 | (2006.01) | |

(52) U.S. Cl.
CPC ............ H01L 43/12 (2013.01); H01L 27/222 (2013.01); H01L 43/02 (2013.01); H01L 43/10 (2013.01)

(58) Field of Classification Search
CPC combination set(s) only.
See application file for complete search history.

(56) References Cited

U.S. PATENT DOCUMENTS

| | | |
|---|---|---|
| 6,964,928 B2 | 11/2005 | Ying et al. |
| 7,750,421 B2 | 7/2010 | Horng et al. |
| 9,028,910 B2 | 5/2015 | Zhou et al. |
| 2004/0101978 A1 | 5/2004 | Linn et al. |
| 2011/0049654 A1* | 3/2011 | Li .................. H01L 43/08 257/421 |
| 2013/0175644 A1 | 7/2013 | Horng et al. |
| 2015/0255507 A1 | 9/2015 | Pakala et al. |
| 2016/0225423 A1 | 8/2016 | Naik et al. |
| 2016/0225817 A1* | 8/2016 | Machkaoutsan ........ H01L 43/02 |

(Continued)

FOREIGN PATENT DOCUMENTS

| | | |
|---|---|---|
| WO | 2017027148 A1 | 2/2017 |
| WO | 2017155508 A1 | 9/2017 |

OTHER PUBLICATIONS

PCT Notification of Transmittal of the International Search Report and the Written Opinion of the International Searching Authority for International Application No. PCT/US2019/056818; dated Feb. 6, 2020; 9 total pages.

*Primary Examiner* — Moin M Rahman
(74) *Attorney, Agent, or Firm* — Patterson + Sheridan, LLP

(57) ABSTRACT

Embodiments of the disclosure provide methods and apparatus for fabricating magnetic tunnel junction (MTJ) structures on a substrate in for hybrid (or called integrated) spin-orbit-torque magnetic spin-transfer-torque magnetic random access memory (SOT-STT MRAM) applications. In one embodiment, the method includes one or more magnetic tunnel junction structures disposed on a substrate, the magnetic tunnel junction structure comprising a first ferromagnetic layer and a second ferromagnetic layer sandwiching a tunneling barrier layer, a spin orbit torque (SOT) layer disposed on the magnetic tunnel junction structure, and a back end structure disposed on the spin orbit torque (SOT) layer.

14 Claims, 11 Drawing Sheets

(56) References Cited

U.S. PATENT DOCUMENTS

| | | | |
|---|---|---|---|
| 2016/0268499 A1* | 9/2016 | You | H01L 43/12 |
| 2016/0308115 A1 | 10/2016 | Kanaya | |
| 2016/0351792 A1* | 12/2016 | Jiang | H01L 43/02 |
| 2016/0351799 A1 | 12/2016 | Xue et al. | |
| 2017/0148849 A1* | 5/2017 | Chuang | H01L 27/228 |
| 2018/0123027 A1* | 5/2018 | Yamane | H01L 43/08 |
| 2018/0123031 A1 | 5/2018 | Adelmann et al. | |
| 2019/0051822 A1* | 2/2019 | Chatterjee | H01L 43/08 |

* cited by examiner

METHODS FOR FORMING STRUCTURES FOR MRAM APPLICATIONS

FIELD

Embodiments of the disclosure relate to methods for fabricating structures used in magnetoresistive random access memory (MRAM) applications. More specifically, embodiments of the disclosure relate to methods for fabricating magnetic tunnel junction structures for MRAM applications.

BACKGROUND

Magnetoresistive random access memory (MRAM) is a type of memory device containing an array of MRAM cells that store data using their resistance values instead of electronic charges. Generally, each MRAM cell includes a magnetic tunnel junction (MTJ) structure. The MTJ structure may have adjustable resistance to represent a logic state "0" or "1." The MTJ structure typically includes a stack of magnetic layers having a configuration in which two ferromagnetic layers are separated by a thin non-magnetic dielectric, e.g., an insulating tunneling layer. A top electrode and a bottom electrode are utilized to sandwich the MTJ structure so electric current may flow between the top and the bottom electrode.

One ferromagnetic layer, e.g., a reference layer, is characterized by a magnetization with a fixed direction. The other ferromagnetic layer, e.g., a storage layer, is characterized by a magnetization with a direction that is varied upon writing of the device, such as by applying a magnetic field. In some devices, an insulator material, such as a dielectric oxide layer, may be formed as a thin tunneling barrier layer sandwiched between the ferromagnetic layers. The layers are typically deposited sequentially as overlying blanketed films. The ferromagnetic layers and the insulator material are subsequently patterned by various etching processes in which one or more layers are removed, either partially or totally, in order to form a device feature.

When the respective magnetizations of the reference layer and the storage layer are antiparallel, a resistance of the magnetic tunnel junction is high having a resistance value $R_{max}$ corresponding to a high logic state "1". On the other hand, when the respective magnetizations are parallel, the resistance of the magnetic tunnel junction is low, namely having a resistance value $R_{min}$ corresponding to a low logic state "0". A logic state of a MRAM cell is read by comparing its resistance value to a reference resistance value $R_{ref}$, which is derived from a reference cell or a group of reference cells and represents an in-between resistance value between that of the high logic state "1" and the low logic state "0".

Spin-transfer-torque magnetic random access memory (STT MRAM) and spin-orbit-torque magnetic random access memory (SOT MRAM) are different chip architectures that each has its own electrical performance and energy efficiency. A demand for hybrid and integrated spin-orbit-torque magnetic spin-transfer-torque magnetic random access memory (SOT-STT MRAM) has recently increased due to its combined benefits. However, how to fabricate SOT-STT MRAMs with desired production yield and well integrated film scheme for the magnetic tunnel junction (MTJ) structure remain a challenge.

Therefore, there is a need in the art for improved methods and apparatus for fabricating MTJ structures for MRAM applications.

SUMMARY

Embodiments of the disclosure provide methods and apparatus for fabricating magnetic tunnel junction (MTJ) structures along with a back end interconnection structure on a substrate for MRAM applications, particularly for hydride spin-orbit-torque magnetic spin-transfer-torque magnetic random access memory (SOT-STT MRAM) applications. In one embodiment, an interconnection structure includes a magnetic tunnel junction structures disposed on a substrate. The magnetic tunnel junction structure comprises a first ferromagnetic layer and a second ferromagnetic layer sandwiching a tunneling barrier layer, a spin orbit torque (SOT) layer disposed on the magnetic tunnel junction structure and a back end structure disposed on the spin orbit torque (SOT) layer.

In another embodiment, a method of forming an interconnection structure includes forming a film stack having a first ferromagnetic layer and a second ferromagnetic layer sandwiching a tunneling barrier layer on a substrate, forming a patterned hardmask layer on the film stack, patterning the film stack using the patterning hardmask layer as an etching mask layer, forming a first insulation material to cover the patterned hardmask layer and the film stack on the substrate, polishing the first insulation material until a top surface of the hardmask layer is exposed, forming a spin orbit torque (SOT) layer on the top surface of the hardmask layer, and forming an back end interconnection structure on the spin orbit torque (SOT) layer.

In yet another embodiment, an interconnection structure for a memory device includes multiple magnetic tunnel junction structures connected to a SOT layer, wherein the magnetic tunnel junction structures have a capping layer connecting the SOT layer fabricated from a material the same from the SOT layer, and a dual damascene back end structure connected to the SOT layer.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings.

To facilitate understanding, identical reference numerals have been used, where possible, to designate identical elements that are common to the figures. It is contemplated that elements disclosed in one embodiment may be beneficially utilized on other embodiments without specific recitation.

It is to be noted, however, that the appended drawings illustrate only typical embodiments of this disclosure and are therefore not to be considered limiting of its scope, for the disclosure may admit to other equally effective embodiments.

DETAILED DESCRIPTION

Embodiments of the disclosure generally provide apparatus and methods for forming a MTJ structure and a back end interconnection structure electrically connected to the MTJ structure disposed on a substrate for MRAM applications. The embodiments of the disclosure may be used in spin-transfer-torque magnetic random access memory (STT MRAM), spin-orbit-torque magnetic random access memory (SOT MRAM), and/or the hybrid (or called integrated) spin-orbit-torque magnetic spin-transfer-torque magnetic random access memory (SOT-STT MRAM) applications. In one embodiment, while pattering the film stack for forming the MTJ structure, a hardmask may be utilized. Such hardmask layer may be the same material of a spin orbit torque (SOT) layer disposed on the MTJ structure. In some examples, the hardmask layer may also be served as the spin orbit torque (SOT) layer when the MTJ structure is patterned and formed. After the MTJ structure and the SOT layer is formed thereon, a back end (e.g., single damascene or dual damascene) interconnection structure may be formed on the SOT layer so that the back end interconnection structure is in electrical communication to the MTJ structure. A chemical mechanical polishing process (CMP) may be utilized while forming the MTJ structure as well as the back end interconnection structure. The MTJ structure as well as the back end interconnection structure may be integratedly formed in a cluster processing system without transferring the substrate out of the system and without breaking vacuum. In some examples, multiple MTJ structures may be connected to the SOT layer that is in further electrical connection to the back end (e.g., single damascene or dual damascene) interconnection structure.

Figure 1:
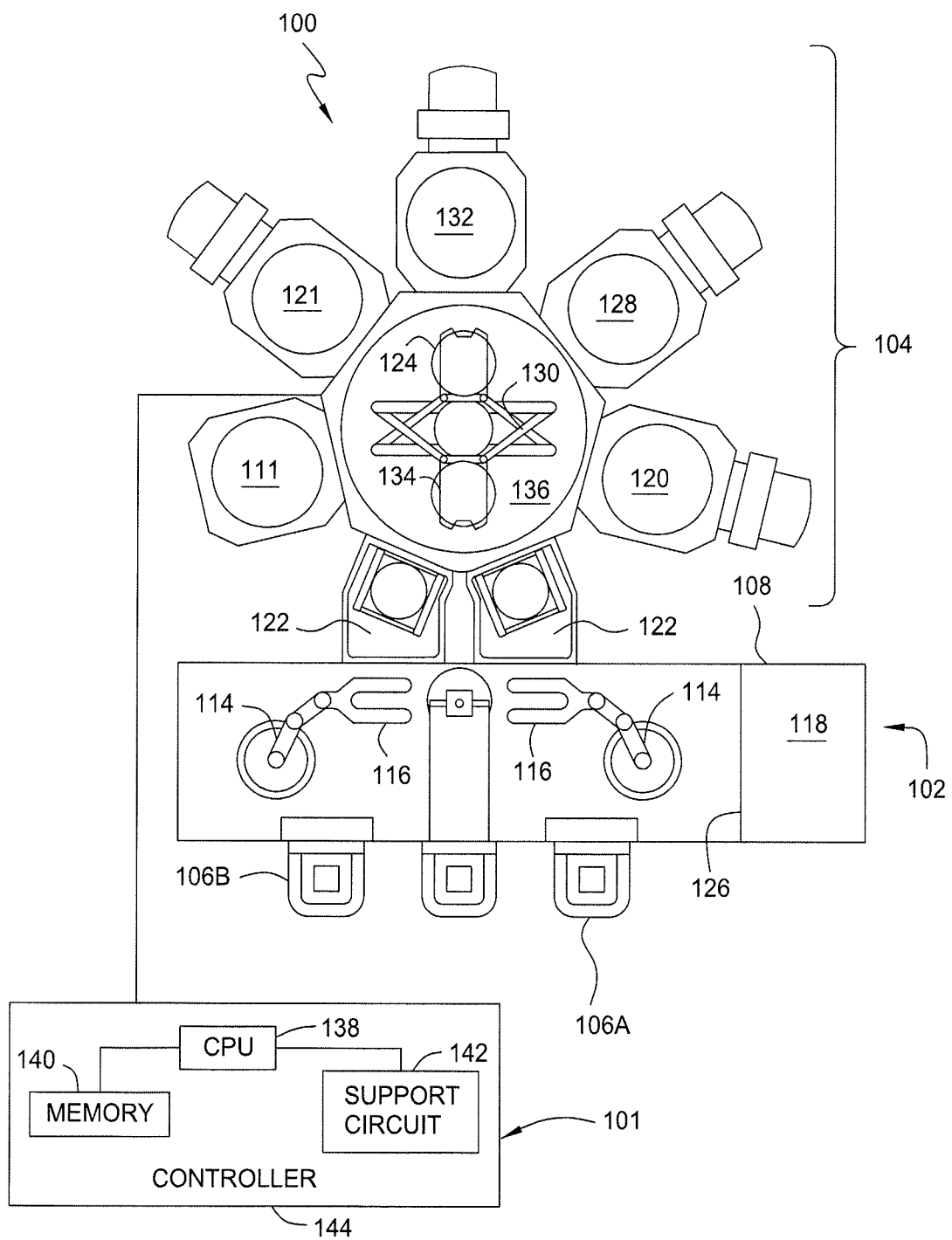
FIG. 1 depicts one embodiment of a cluster processing system for practice one embodiment of the present disclosure.

FIG. 1 is a schematic, top plan view of an exemplary cluster processing system 100 that includes one or more of the processing chambers 111, 121, 132, 128, 120 that are incorporated and integrated therein. In one embodiment, the cluster processing system 100 may be a Centura® or Endura® integrated processing system, commercially available from Applied Materials, Inc., located in Santa Clara, Calif. It is contemplated that other processing systems (including those from other manufacturers) may be adapted to benefit from the disclosure.

The cluster processing system 100 includes a vacuum-tight processing platform 104, a factory interface 102, and a system controller 144. The platform 104 includes a plurality of processing chambers 111, 121, 132, 128, 120 and at least one load-lock chamber 122 that is coupled to a vacuum substrate transfer chamber 136. Two load lock chambers 122 are shown in FIG. 1. The factory interface 102 is coupled to the transfer chamber 136 by the load lock chambers 122.

In one embodiment, the factory interface 102 comprises at least one docking station 108 and at least one factory interface robot 114 to facilitate transfer of substrates. The docking station 108 is configured to accept one or more front opening unified pod (FOUP). Two FOUPS 106A-B are shown in the embodiment of FIG. 1. The factory interface robot 114 having a blade 116 disposed on one end of the robot 114 is configured to transfer the substrate from the factory interface 102 to the processing platform 104 for processing through the load lock chambers 122. Optionally, one or more metrology stations 118 may be connected to a terminal 126 of the factory interface 102 to facilitate measurement of the substrate from the FOUPS 106A-B.

Each of the load lock chambers 122 have a first port coupled to the factory interface 102 and a second port coupled to the transfer chamber 136. The load lock chambers 122 are coupled to a pressure control system (not shown) which pumps down and vents the load lock chambers 122 to facilitate passing the substrate between the vacuum environment of the transfer chamber 136 and the substantially ambient (e.g., atmospheric) environment of the factory interface 102.

The transfer chamber 136 has a vacuum robot 130 disposed therein. The vacuum robot 130 has a blade 134 capable of transferring substrates 124 among the load lock chambers 122, the metrology system 110 and the processing chambers 111, 121, 132, 128, 120.

In one embodiment of the cluster processing system 100, the cluster processing system 100 may include one or more processing chambers 111, 121, 132, 128, 120, which may be a deposition chamber (e.g., physical vapor deposition chamber, chemical vapor deposition, or other deposition chambers), annealing chamber (e.g., high pressure annealing chamber, RTP chamber, laser anneal chamber), etch chamber, cleaning chamber, curing chamber, lithographic exposure chamber, or other similar type of semiconductor processing chambers. In some embodiments of the cluster processing system 200, one or more of processing chambers 111, 121, 132, 128, 120, the transfer chamber 136, the factory interface 102 and/or at least one of the load lock chambers 122.

The system controller 144 is coupled to the cluster processing system 100. The system controller 144, which may include the computing device 101 or be included within the computing device 101, controls the operation of the cluster processing system 100 using a direct control of the process chambers 111, 121, 132, 128, 120 of the cluster processing system 100. Alternatively, the system controller 144 may control the computers (or controllers) associated with the process chambers 111, 121, 132, 128, 120 and the cluster processing system 100. In operation, the system controller 144 also enables data collection and feedback from the respective chambers to optimize performance of the cluster processing system 100.

The system controller 144, much like the computing device 101 described above, generally includes a central processing unit (CPU) 138, a memory 140, and support circuit 142. The CPU 138 may be one of any form of a general purpose computer processor that can be used in an industrial setting. The support circuits 142 are conventionally coupled to the CPU 138 and may comprise cache, clock circuits, input/output subsystems, power supplies, and the like. The software routines transform the CPU 138 into a specific purpose computer (controller) 144. The software routines may also be stored and/or executed by a second controller (not shown) that is located remotely from the cluster processing system 100.

Figure 2:
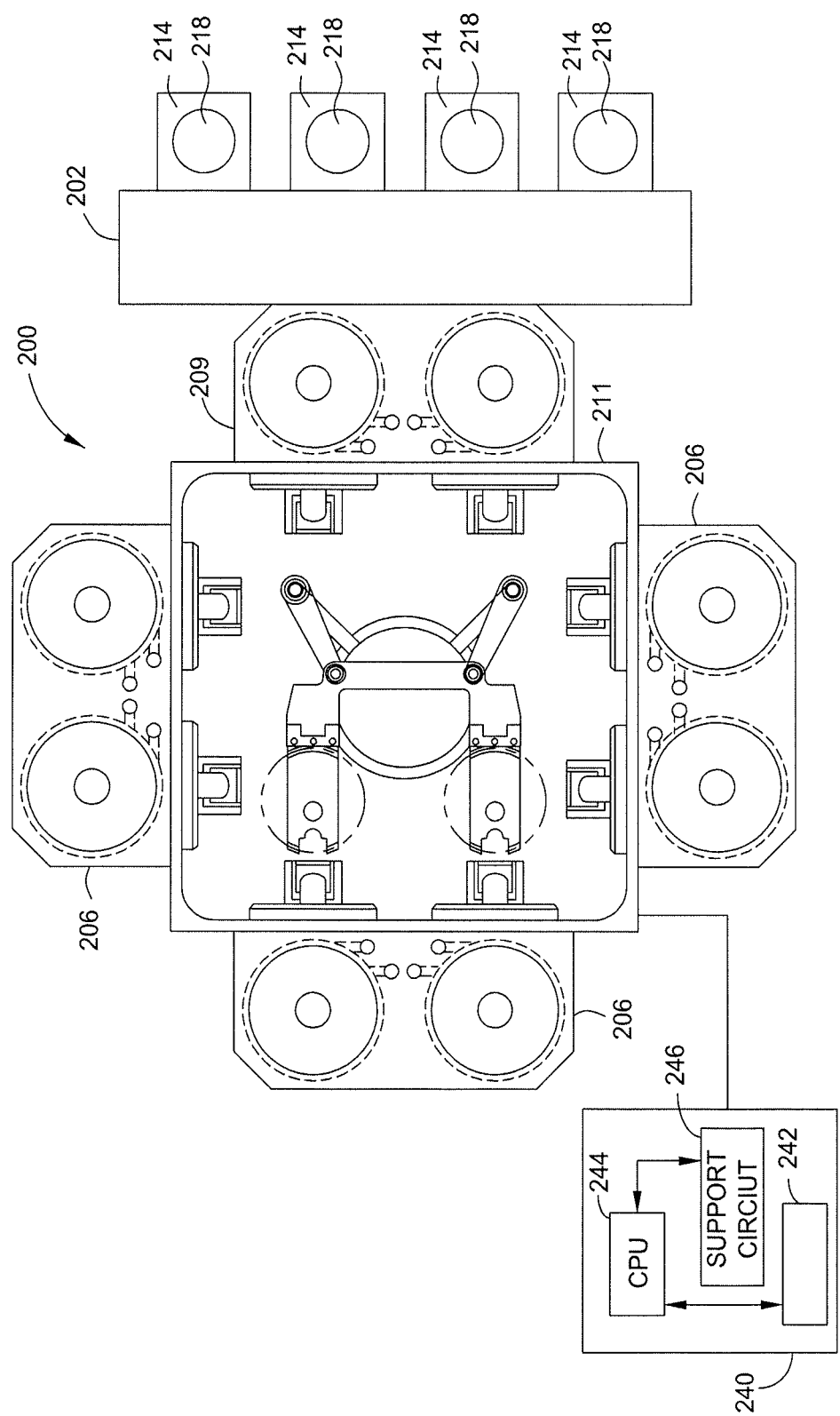
FIG. 2 depicts another embodiment of a cluster processing system for practice one embodiment of the present disclosure.

FIG. 2 depicts a plan view of another example of a cluster processing system 200 that the methods described herein may be practiced. One processing system that may be adapted to benefit from the disclosure is a 300 mm or 450 mm PRODUCER® processing system, commercially available from Applied Materials, Inc., of Santa Clara, Calif. The cluster processing system 200 generally includes a front platform 202 where substrate cassettes 218 included in FOUPs 214 are supported and substrates are loaded into and unloaded from a loadlock chamber 209, a transfer chamber 211 housing a substrate handler 213 and a series of tandem processing chambers 206 mounted on the transfer chamber 211.

Each of the tandem processing chambers 206 includes two process regions for processing the substrates. The two process regions share a common supply of gases, common pressure control, and common process gas exhaust/pumping system. Modular design of the system enables rapid conversion from one configuration to any other. The arrangement and combination of chambers may be altered for purposes of performing specific process steps. Any of the tandem processing chambers 206 can include a lid according to aspects of the disclosure as described below that includes one or more chamber configurations. It is noted that the cluster processing system 200 may be configured to perform a deposition process, etching process, curing processes, lithographic exposure process or heating/annealing process as needed.

In one implementation, the cluster processing system 200 can be adapted with one or more of the tandem processing chambers having supporting chamber hardware known to accommodate various other known processes such as chemical vapor deposition (CVD), physical vapor deposition (PVD), atomic layer deposition (ALD), spin coating, etching, curing, lithographic exposure or heating/annealing process and the like. For example, the cluster processing system 200 can be configured with one of the processing chambers 206 as a chemical vapor deposition processing chamber or a physical vapor deposition chamber for forming a passivation layer or a metal containing dielectric layers, metal layers or insulating materials formed on the substrates. Such a configuration can enhance research and development fabrication utilization and, if desired, substantially eliminate exposure of films as etched to atmosphere.

A controller 240, including a central processing unit (CPU) 244, a memory 242, and support circuits 246, is coupled to the various components of the cluster processing system 200 to facilitate control of the processes of the present disclosure. The memory 242 can be any computer-readable medium, such as random access memory (RAM), read only memory (ROM), floppy disk, hard disk, or any other form of digital storage, local or remote to the cluster processing system 200 or CPU 244. The support circuits 246 are coupled to the CPU 244 for supporting the CPU in a conventional manner. These circuits include cache, power supplies, clock circuits, input/output circuitry and subsystems, and the like. A software routine or a series of program instructions stored in the memory 242, when executed by the CPU 244, executes the tandem processing chambers 206.

Figure 3:
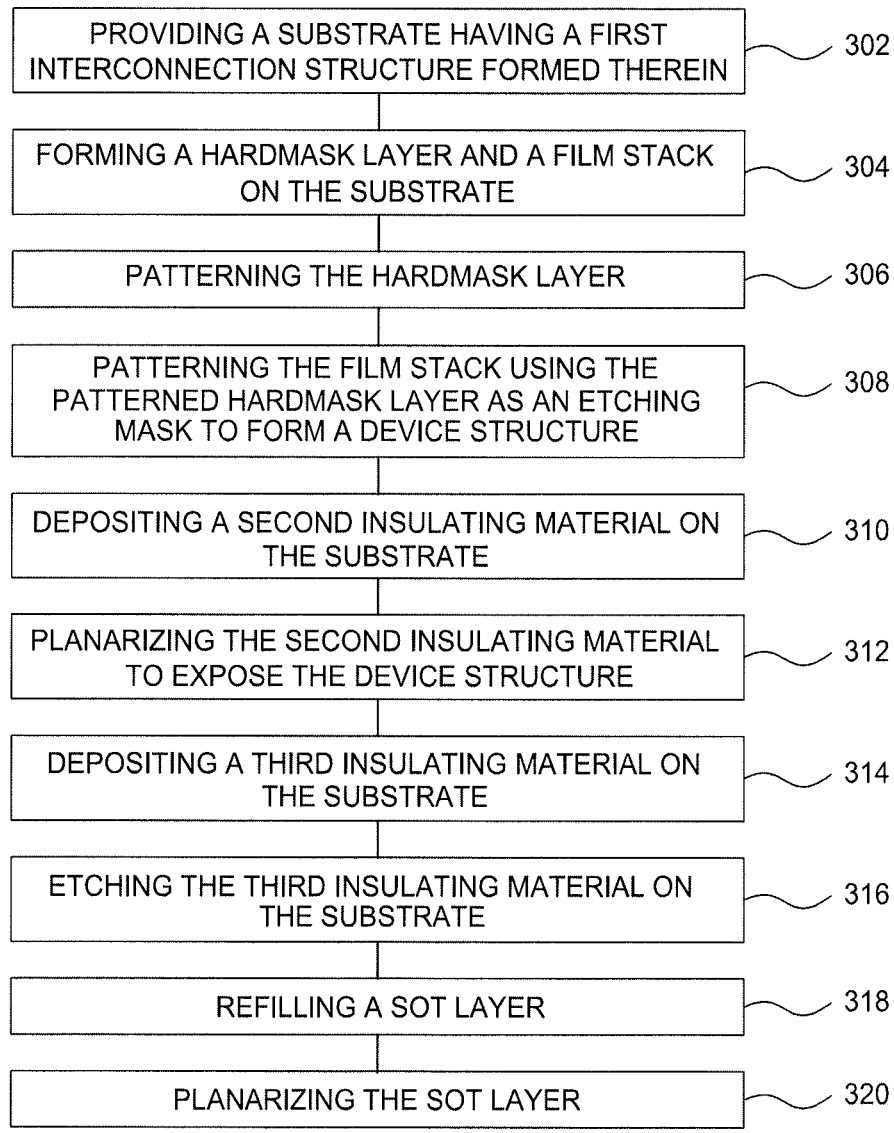
FIG. 3 depicts a flow diagram illustrating a method for fabricating magnetic tunnel junction (MTJ) structures along with a back end interconnection structure according to one embodiment of the present disclosure.

FIG. 3 depicts a flow diagram illustrating a process 300 for manufacturing MTJ structures and back end interconnection structures on a substrate for MRAM applications according to one embodiment of the present disclosure. It is noted that the process 300 for manufacturing MTJ structures and back end interconnection structures may be utilized in spin-transfer-torque magnetic random access memory (STT MRAM), spin-orbit-torque magnetic random access memory (SOT MRAM), and/or the hybrid (or called integrated) spin-orbit-torque magnetic spin-transfer-torque magnetic random access memory (SOT-STT MRAM) applications, particularly in hybrid (or called integrated) spin-orbit-torque magnetic spin-transfer-torque magnetic random access memory (SOT-STT MRAM) applications. FIGS. 4A-4K are schematic cross-sectional views of an interconnection structure 450 formed on a substrate 402 at various stages of the process of FIG. 3. It is contemplated that the process 300 may be performed in suitable processing chambers, including deposition chambers, etching chambers or other suitable processing chambers incorporated in the cluster processing systems 100 or 200 depicted in FIGS. 1 and 2. It is also noted that the process 300 may be performed in suitable processing chambers, including those from other manufacturers.

Figure 4A:
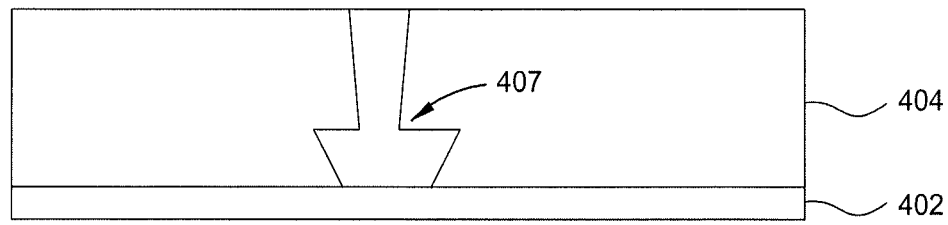
FIGS. 4A-4K are cross sectional views of a substrate at various stages of the method of FIG. 3.

The process 300 begins at operation 302 by providing a substrate, such as the substrate 402 having a first interconnection structure 407 formed in a first insulating structure 404, as shown in FIG. 4A. The first interconnection structure 407 and the first insulating structure 404 may be formed in one or more of the processing chambers incorporated in the cluster processing system 100 or 200 depicted in FIGS. 1 and 2. In one embodiment, the substrate 402 comprises metal or glass, silicon, dielectric bulk material and metal alloys or composite glass, crystalline silicon (e.g., Si<100> or Si<111>), silicon oxide, strained silicon, silicon germanium, germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, or sapphire. The substrate 402 may have various dimensions, such as 200 mm, 300 mm, 450 mm or other diameter, as well as, being a rectangular or square panel. Unless otherwise noted, examples described herein are conducted on substrates with a 200 mm diameter, a 300 mm diameter, or a 450 mm diameter substrate. In one embodiment, the substrate 402, as shown in FIG. 4A, includes the first interconnection structure 407 formed in the first insulating structure 404 disposed on the substrate 402.

The first insulating structure 404 may comprise a dielectric material, such as SiN, SiCN, $SiO_2$, SiON, SiC, amorphous carbon, SiOC or other suitable low dielectric constant material and the like. The first interconnection structure 407 includes a metal containing material, such as aluminum, tungsten, copper, nickel, and the like. In one example, the first insulating structure 404 includes a low dielectric constant dielectric material, such as SiOC, and the first interconnection structure 407 includes copper.

Figure 4B:
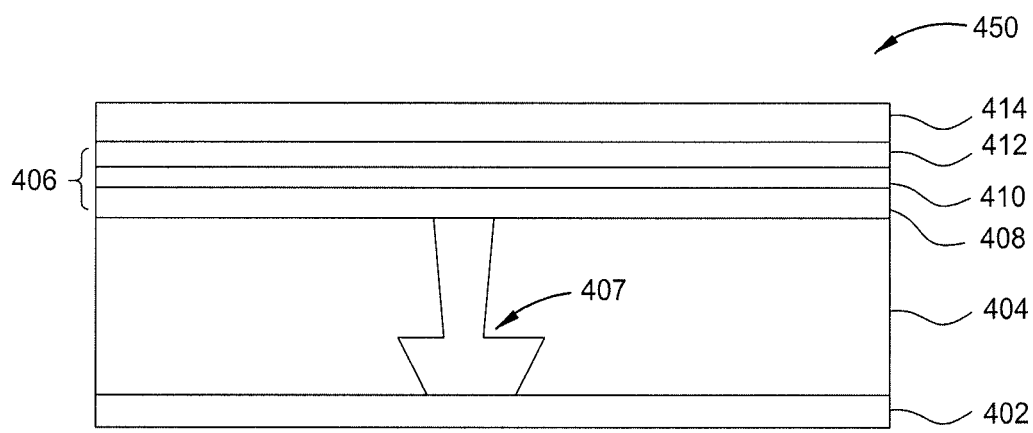

At operation 304, a film stack 406 and a hardmask layer 414 are disposed on the substrate 402, as shown in FIG. 4B. The film stack 406 and the hardmask layer 414 may be formed in one or more of the processing chambers incorporated in the cluster processing system 100 or 200 depicted in FIGS. 1 and 2. The film stack 406 further includes a first ferromagnetic layer 412 and a second ferromagnetic layer 408 sandwiching a tunneling barrier layer 410. Though the film stack 406 described in FIGS. 4B-4K only includes three layers, it is noted that additional or multiple film layers can be further formed in the film stack 406 as needed. One of the examples of the additional or multiple film layers formed in the film stack 406 is further described below with reference to FIG. 7. The tunneling barrier layer 410 may be an oxide barrier layer in the case of a tunnel junction magnetoresistive (TMR) sensor or a conductive layer in the case of a giant magnetoresistive (GMR) sensor. When the film stack 406 is configured to form a TMR sensor, then the tunneling barrier layer 410 may comprise $MgO$, $HfO_2$, $TiO_2$, $TaO_x$, $Al_2O_3$, or other suitable materials. In the embodiment depicted in FIGS. 4B-4K, the tunneling barrier layer 410 may comprise MgO having a thickness of about 1 to about 15 Angstroms, such about 10 Angstroms.

The first and second ferromagnetic layers 412, 408 may be a metal containing material or a magnetic material, such as Mo, Ir, Ru, Ta, MgO, Hf, CoFe, CoFeB and the like. It is noted that the first and second ferromagnetic layers 412, 408 may be fabricated from the same or different materials as needed.

The hardmask layer 414 is disposed on the film stack 406 and will be later utilized as an etching mask layer during the following patterning and/or etching process. The hardmask layer 414 is formed from a material that is similar to or the same as a spin-orbit-torque (SOT) layer 424 (shown in FIG. 4I), which will be later formed thereon. In one example, the hardmask layer 414 is fabricated from CoFeB, MgO, Ta, W, Pt, CuBi, Mo, Ru, alloys thereof, or combinations thereof.

Figure 4C:
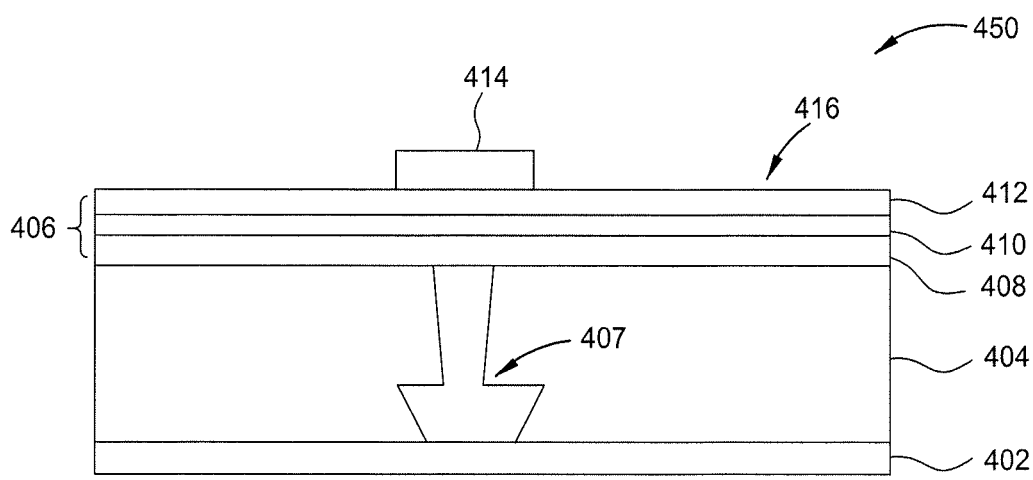

At operation 304, a patterning process, e.g., an etching process, is first performed to pattern the hardmask layer 414, forming an opening area 416 in the hardmask layer 414, as shown in FIG. 4C. The first patterning process may be performed in one or more of the processing chambers incorporated in the cluster processing system 100 or 200 depicted in FIGS. 1 and 2. The opening area 416 formed in the hardmask layer 414 expose a portion of the film stack 406 for patterning so as to form a magnetic tunnel junction (MTJ) structure 452 (shown in FIG. 4D) with a desired dimension from the film stack 406.

Figure 4D:
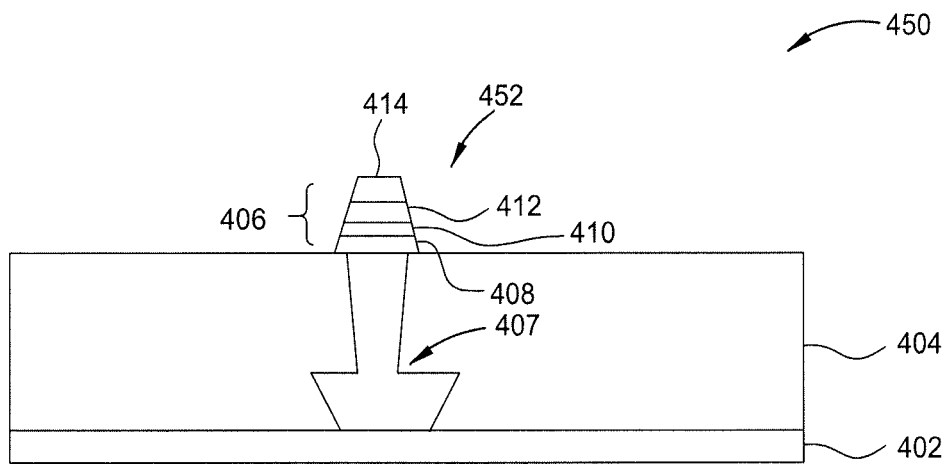

At operation 308, a second patterning process is performed to pattern (e.g., etch) the film stack 406 exposed by the patterned hardmask layer 414 to form a magnetic tunnel junction (MTJ) structure 452, as shown in FIG. 4D, until the underlying first insulating material 404 is exposed. The second patterning process may be performed in one or more of the processing chambers incorporated in the cluster processing system 100 or 200 depicted in FIGS. 1 and 2. It is noted that the patterned hardmask layer 414 is intended to be left and remained on the film stack 406, forming as part of the magnetic tunnel junction (MTJ) structure 452 after the patterning process performed at operation 308. Thus, no additional ash or stripping process is required to remove the hardmask layer 414 after the second patterning process. The second patterning process for patterning the film stack 406 may include several steps or different recipes configured to supply different gas mixtures or etchants to etch different layers in accordance with the materials included in each layer.

During patterning, an etching gas mixture or several gas mixtures with different etching species are sequentially supplied into the substrate surface to remove the portion of the film stack 406 exposed by the patterned hardmask layer 414 from the substrate 402.

The end point of the patterning process at operation 308 may be controlled by time or other suitable method. For example, the patterning process may be terminated after performing for between about 200 seconds and about 10 minutes until the underlying first insulating material 404 is exposed, as shown in FIG. 4D. The patterning process may be terminated by determination from an endpoint detector, such as an OES detector or other suitable detector as needed.

It is noted that although the profile of the magnetic tunnel junction (MTJ) structure 452 as formed after patterning the film stack 406 has a tapered sidewalls, it is noted that the magnetic tunnel junction (MTJ) structure 452 may have substantially vertical sidewall profiles or any suitable sidewall profiles with desired slopes as needed.

Figure 4E:
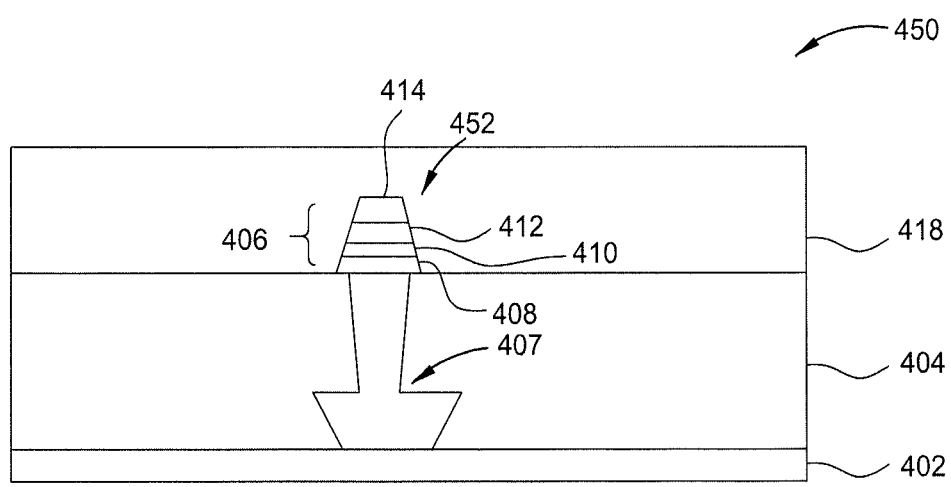

At operation 310, after the patterning process, a deposition process is performed to form a second insulating structure 418 on the magnetic tunnel junction (MTJ) structure 452 (e.g., including the patterned hardmask layer 414 and the patterned film stack 406), as shown in FIG. 4E. The second insulating structure 418 may be formed in one or more of the processing chambers incorporated in the cluster processing system 100 or 200 depicted in FIGS. 1 and 2. The second insulating structure 418 is formed having a sufficient thickness to cover the magnetic tunnel junction (MTJ) structure 452. The second insulating structure 418 may be a dielectric layer formed by a deposition process performed after the patterning process at operation 308. The second insulating structure 418 may be the same or similar to the first insulating structure 404. In one example, the second insulating structure 418 includes a low dielectric constant material comprising SiOC.

Figure 4F:
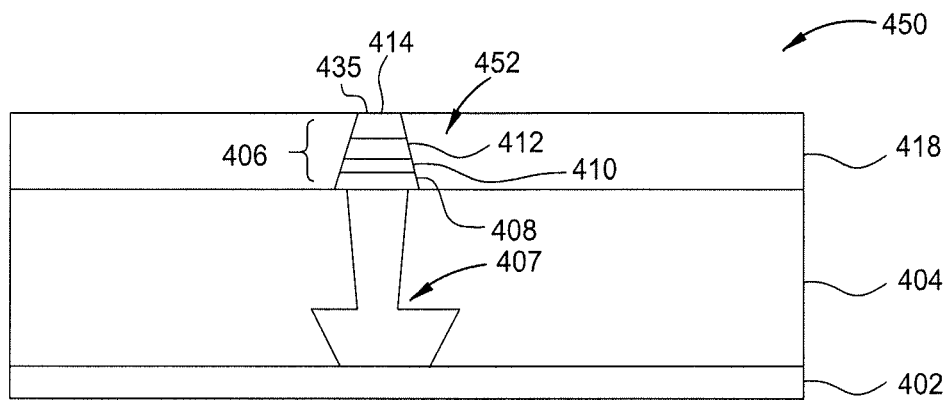

At operation 312, a chemical mechanical polishing process is performed to polish away the excess second insulating structure 418 so as to expose a top surface 435 of the magnetic tunnel junction (MTJ) structure 452 (e.g., a top surface 435 of the patterned hardmask layer 414), as shown in FIG. 4F, so that the top surface 435 of the patterned hardmask layer 414 is substantially coplanar with the second insulating structure 418. The CMP process as performed may remove the excess second insulating structure 418 without adversely damaging or over-polishing the nearby materials when the magnetic tunnel junction (MTJ) structure 452 is exposed. By using a relatively low polishing downforce and slow polishing rate, the second insulating structure 418 may be removed without damaging or over polishing away material from the magnetic tunnel junction (MTJ) structure 452.

The chemical mechanical polishing process may remove or polish the second insulating structure 418 by using a fluid supplied during the polishing process, or by DI water. A relatively soft polishing pad, such as a pad having elasticity greater 90% may be used to during the chemical mechanical polishing process. During polishing, as the polishing pad selected has a relatively soft surface, thus, slurry or other chemical fluid may be eliminated as needed. In one example, DI water may be utilized during the chemical mechanical polishing process. The chemical mechanical polishing process is followed by a cleaning process as needed to enhance the cleanliness of the substrate surface.

Figure 4G:
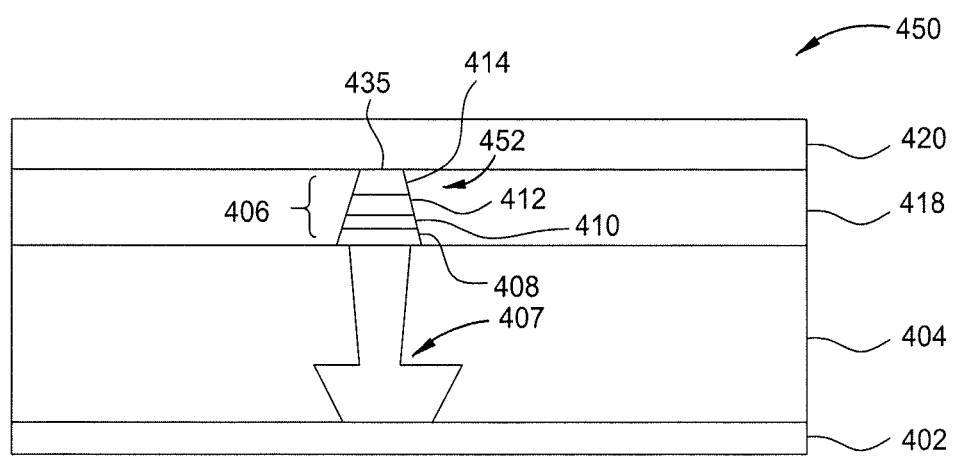

At operation 314, a third insulating structure 420 is formed on the magnetic tunnel junction (MTJ) structure 452 and the second insulating structure 418, as shown in FIG. 4G. The third insulating structure 420 may be formed in one or more of the processing chambers incorporated in the cluster processing system 100 or 200 depicted in FIGS. 1 and 2. Similarly, the third insulating structure 420 may be formed from any suitable deposition techniques, such as CVD, ALD, PVD, spin-coating, spray coating or any suitable deposition processes. The third insulating structure 420 may be the same or similar to the first or second insulating structure 404, 418. In one example, the third insulating structure 420 includes a low dielectric constant material comprising SiOC.

Figure 4H:
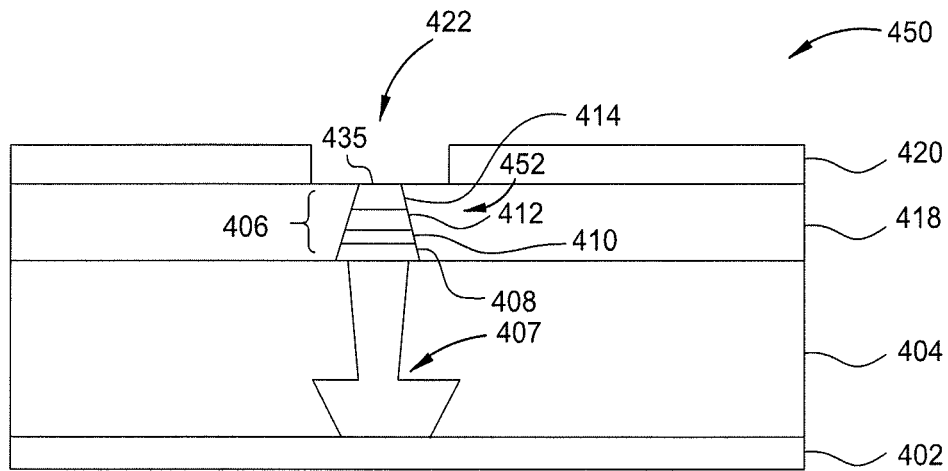

At operation 316, another patterning process is performed to form an opening 422 in the third insulating structure 420 to expose the top surface 435 of the magnetic tunnel junction (MTJ) structure 452, as shown in FIG. 4H. The pattering process may be performed in one or more of the processing chambers incorporated in the cluster processing system 100 or 200 depicted in FIGS. 1 and 2. One or more patterning masks (not shown) may be utilized to assist forming the opening 422 in the third insulating structure 420. The patterning process is performed to pattern the third insulating structure 420 until the top surface 435 of the magnetic tunnel junction (MTJ) structure 452 is exposed.

Figure 4I:
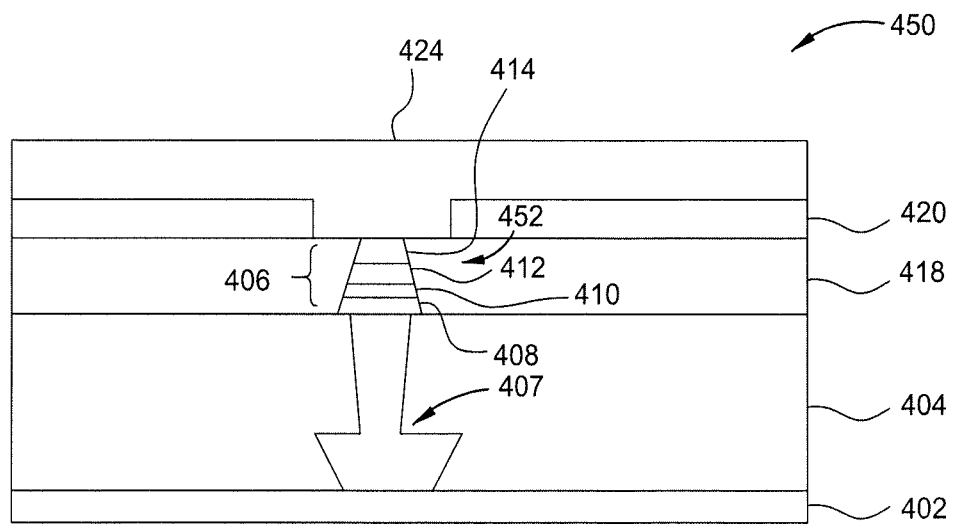

At operation 318, a deposition process is performed to form a spin orbit torque (SOT) layer 424 on the substrate, filling the opening 422 defined in and above the third insulating structure 420, as shown in FIG. 4I. The deposition process may be performed in one or more of the processing chambers incorporated in the cluster processing system 100 or 200 depicted in FIGS. 1 and 2. The material of the spin orbit torque (SOT) layer 424 is selected to be similar or the same as the hardmask layer 414 so as to promote the electrical performance of the magnetic tunnel junction (MTJ) structure 452. Furthermore, as the material of the spin orbit torque (SOT) layer 424 and the hardmask layer 414 are similar or the same, the manufacturing concerns or complexity may be reduced as the adhesion control at the interface between the spin orbit torque (SOT) layer 424 and the hardmask layer 414 is relatively easy and compatible. The hardmask layer 414 remained in the magnetic tunnel junction (MTJ) structure 452 may also serve as a capping layer to provide a good electrical contact to the spin orbit torque (SOT) layer 424. In one embodiment, the spin orbit torque (SOT) layer 424 is fabricated from Ta, Ru, MgO, W, Pt, CuBi, Mo, or combinations thereof.

Figure 4J:
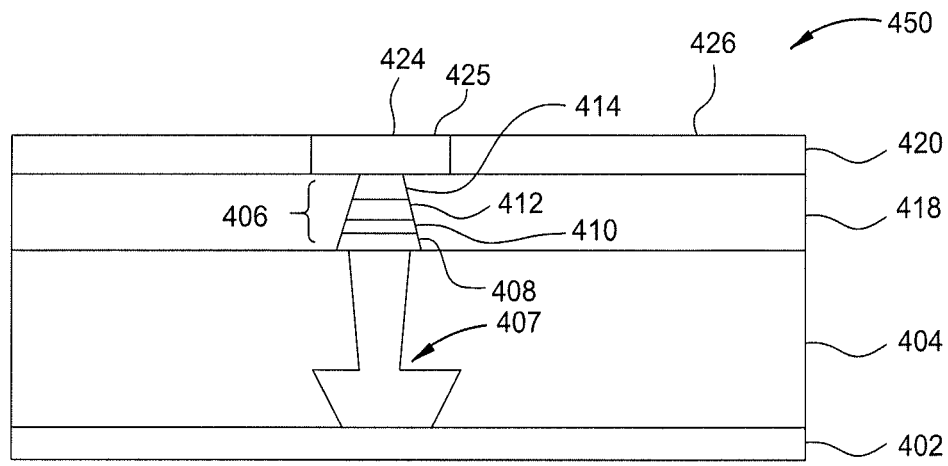

At operation 320, a chemical mechanical polishing process is further performed to polish away the excess spin orbit torque (SOT) layer 424 so as to have a top surface 425 of the spin orbit torque (SOT) layer 424 substantially coplanar with a top surface 426 of the third insulating structure 420, as shown in FIG. 4J. The CMP process as performed may remove the excess spin orbit torque (SOT) layer 424 without adversely damaging or over-polishing the nearby materials so that the excess spin orbit torque (SOT) layer 424 can be filled in the third insulating structure 420 with the desired dimension to provide electrical connection to the underlying magnetic tunnel junction (MTJ) structure 452. By using a relatively low polishing downforce and slow polishing rate, the excess spin orbit torque (SOT) layer 424 may be removed, without damaging or over polishing away material from the magnetic tunnel junction (MTJ) structure 452 and the third insulating structure 420.

Figure 4K:
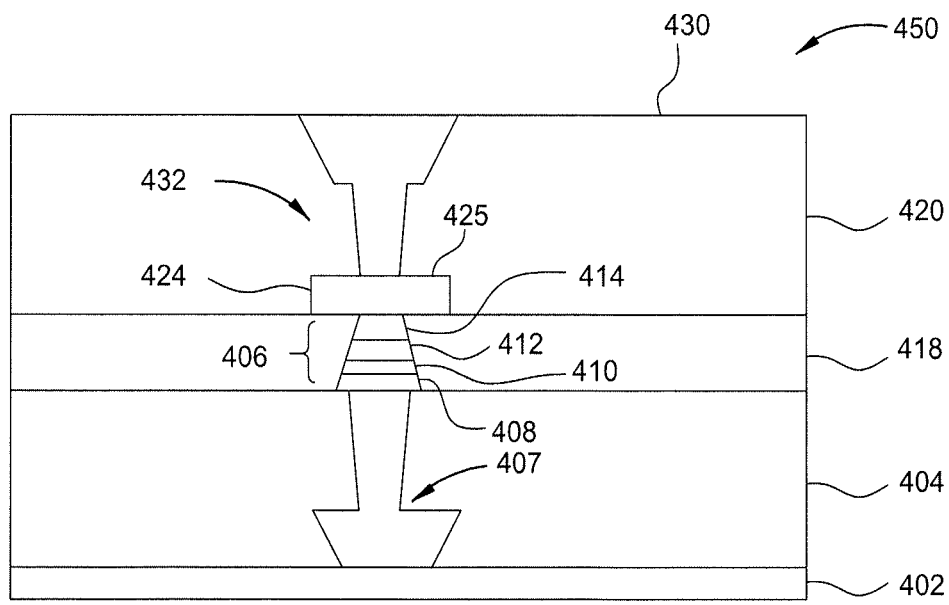

After the SOT layer 424 is formed in the third insulating structure 420, an additional interconnection structure 432 is formed above the spin orbit torque (SOT) layer 424 to provide electrical connection and/or communication to the magnetic tunnel junction (MTJ) structure 452, as shown in FIG. 4K. The additional interconnection structure 432 is also formed in a fourth insulating structure 430 to form a back end structure that has electrical contact and communication to the magnetic tunnel junction (MTJ) structure 452. The additional interconnection structure 432 formed in the fourth insulating structure 430 is a single damascene structure. It is noted that the additional interconnection structures may be formed in other forms, such as dual damascene structure or other suitable structures.

Figure 5:
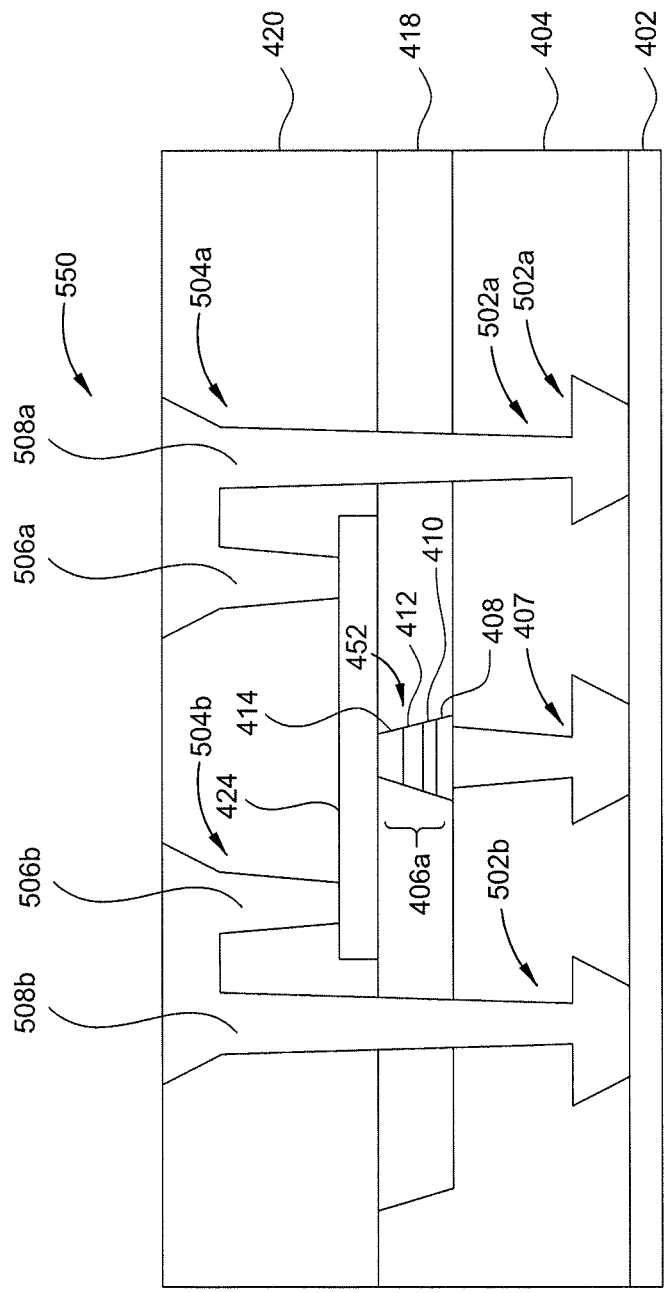
FIG. 5 is a cross sectional view of another example of a magnetic tunnel junction (MTJ) structure with a back end interconnection structure formed on a substrate.

FIG. 5 depicts another example of an interconnection structure 550 formed on the substrate 402. Similar to the interconnection structure 450 depicted in FIG. 4K, the interconnection structure 550 includes the first interconnection structure 407 formed in the first insulating structure 404, the magnetic tunnel junction (MTJ) structure 452 formed on the first interconnection structure 407 and a SOT layer 424 formed on the magnetic tunnel junction (MTJ) structure 452. However, the SOT layer 424 in this example as shown in FIG. 5 has a relatively longer width that allows additional two upper interconnection structures 504a, 504b formed thereon. The two upper interconnection structures 504a, 504b each has a first conductive line 506a, 506b connecting to the SOT layer 424 while a second conductive line 508a, 508b connecting to two lower interconnection structures 502a, 502b. The upper interconnection structures 504a, 504b as utilized here are dual damascene structures. The two upper interconnection structures 504a, 504b are in direct contact and in electrical connection/communication with the two lower interconnection structures 502a, 502b through the second conductive line 508a, 508b. The first interconnection structure 407 and the magnetic tunnel junction (MTJ) structure 452 may be vertically interposed between the two upper interconnection structures 504a, 504b and the two lower interconnection structures 502a, 502b, as shown in FIG. 5.

Figure 6:
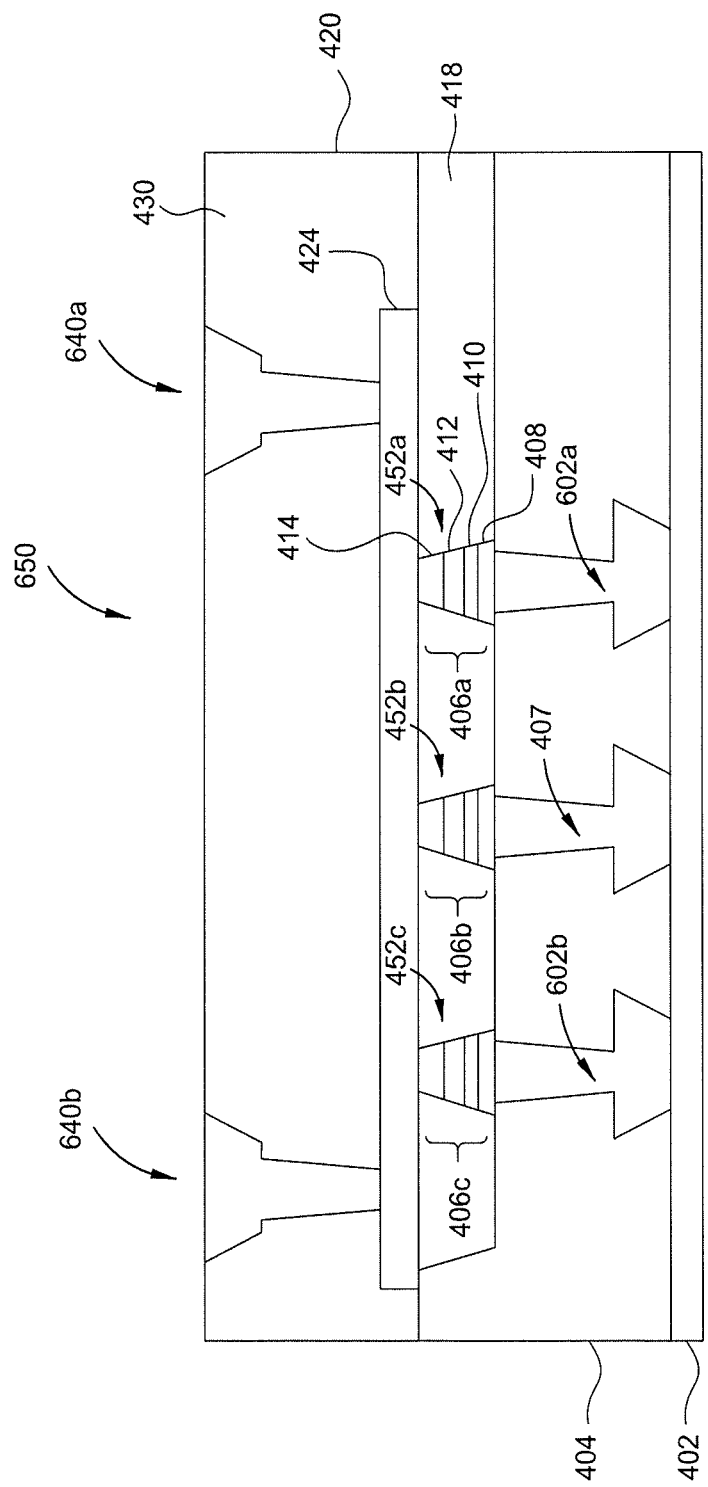
FIG. 6 is a cross sectional view of yet another example of a magnetic tunnel junction (MTJ) structure with a back end interconnection structure formed on a substrate.

FIG. 6 depicts yet another example of an interconnection structure 650 formed on the substrate 402. The interconnection structure 650 comprises multiple, such as three, magnetic tunnel junction (MTJ) structures 452a, 452b, 452c each formed on a lower interconnection structure 602a, 602b, 602c. The SOT layer 424 has a relatively long width so as to allow additional two upper interconnection structures 640a, 640b formed on the SOT layer 424. In this example, the upper interconnection structures 640a, 640b are not in direct contact with the lower interconnection structures 602a, 602b, 602c. Instead, the upper interconnection structures 640a, 640b is in electrical connection/communication with the lower interconnection structures 602a, 602b, 602c through the SOT layer 424 and the three magnetic tunnel junction (MTJ) structures 452a, 452b, 452c interposed therebetween. By utilizing the multiple magnetic tunnel junction (MTJ) structures 452a, 452b, 452c and the interconnection structures 602a, 602b, 602c, 640a, 640b, the electrical performance may be enhanced and device densities may be increased.

Figure 7:
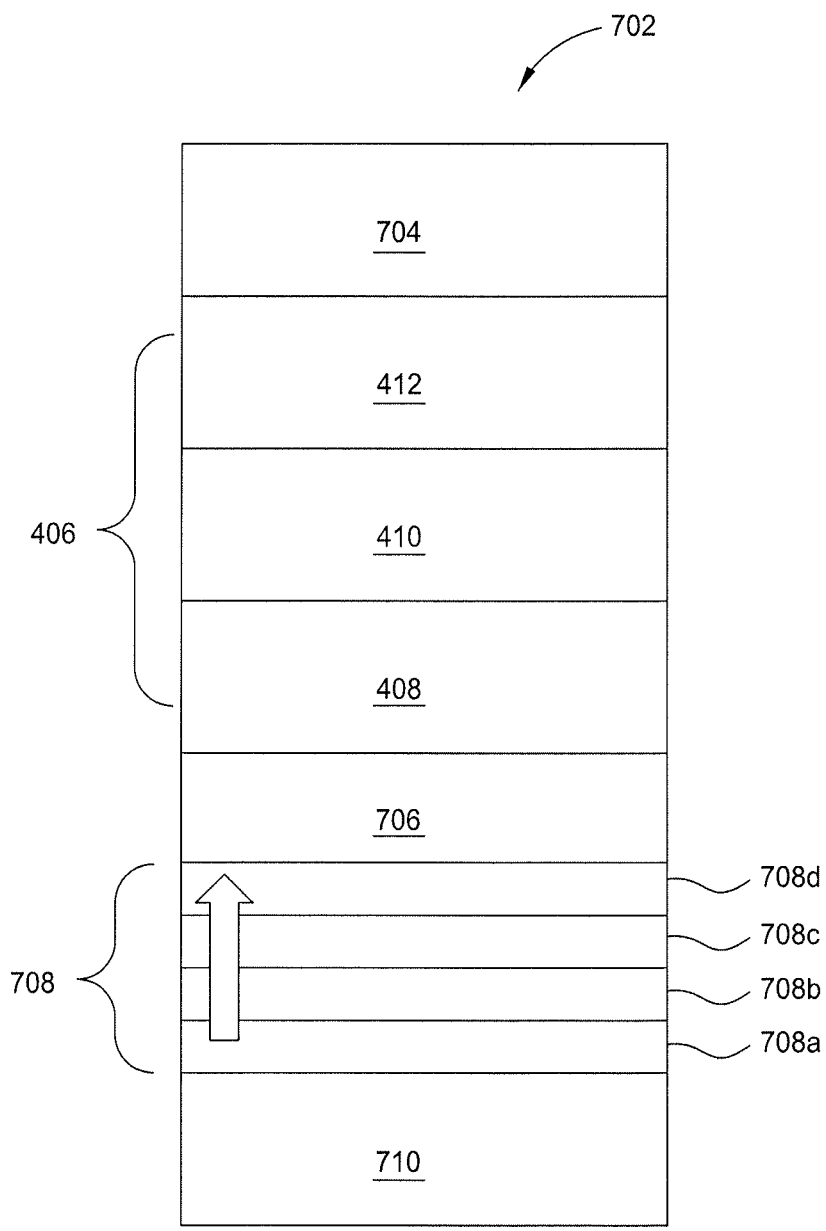
FIG. 7 is a cross sectional view of one example of a magnetic tunnel junction (MTJ) structure that is used in FIGS. 4A-4I, FIG. 5 or FIG. 6.

FIG. 7 depicts another example of a magnetic tunnel junction (MTJ) 702. The magnetic tunnel junction (MTJ) 702 may be utilized as the magnetic tunnel junction (MTJ) 452 depicted in FIGS. 4K, 5 and 6 as well. The magnetic tunnel junction (MTJ) 702 includes the film stack 406 depicted above with the first ferromagnetic layer 412 and the second ferromagnetic layer 408 sandwiching the tunneling barrier layer 410. In additional to the film stack 406, a seed layer 710 may be formed in a bottom of the magnetic tunnel junction (MTJ) 702. The materials may be utilized to form the seed layer 710 including NiCr, Pt, Cr, CoFeB, Ta, Ru, TaN, alloys or combinations thereof. A pinned layer 708 may be formed on the seed layer 710. The pinned layer 708 may comprise one or more of several types of pinned layers, such as a simple pinned, antiparallel pinned, self-pinned or antiferromagnetic pinned sensor. In one example depicted in FIG. 7, the pinned layer 708 includes multiple layers, such as four layers. It is noted that the number of the pinned layer 708 may be any number as needed. The pinned layer 708 may be constructed of several magnetic materials such as a metal alloy with dopants, such as boron dopants, oxygen dopants or other suitable materials. Metal alloys may be a nickel containing material, platinum containing material, Ru containing material, a cobalt containing material, tantalum containing materials and palladium containing materials. Suitable examples of the magnetic materials that may comprise the pinned layer 708 include Ru, Ta, Co, Pt, Ni, TaN, $NiFeO_x$, NiFeB, $CoFeO_xB$, CoFeB, CoFe, $NiO_xB$, $CoBO_x$, $FeBO_x$, CoFeNiB, CoPt, CoPd, $TaO_x$ and the like.

An Ruderman-Kittel-Kasuya-Yosida (RKKY) layer 706 (also called a coupling layer) may be disposed on the pinned layer 708 below the film stack 406. The RKKY layer 706 may be formed to control spin directions in the magnetic tunnel junction (MTJ) 702. The materials utilized to fabricate the RKKY layer 706 include Ir, Ru, Ta, W, Mo, alloys thereof, or combinations thereof.

A capping layer 704 may be formed on the film stack 406. In the example depicted above, the capping layer 704 may be the patterned hardmask layer 414 described above with reference to FIGS. 4I, 5 and 6. In some examples, additional capping layers may be formed on the film stack 406, on the patterned hardmask layer 414 or other suitable positions in the magnetic tunnel junction (MTJ) 702 as needed. Suitable examples of the capping layer 704 (or the patterned hardmask layer 414) include one or more layers of at one or more of CoFeB, MgO, Ta, W, Pt, CuBi, Mo, Ru, alloys thereof and combinations thereof. In one example, the film stack 710 in total includes multiple layers including TaN, NiCr, Co, Ni, Ir, Co or Ni, Mo, CoFeB, MgO, CoFeB, Mo, CoFeB, MgO, CoFeB, Mo and Ru layers.

In the example depicted in FIG. 7, all these layers or film stack 710, 708, 706, 406, 704 may be formed by any suitable techniques, such as CVD, PVD, ALD, spin-coating, spray coating, and any suitable manners. One example of systems that may be used to form these layers includes CENTURA®, PRECISION 5000° and PRODUCER® deposition systems, all available from Applied Materials Inc., Santa Clara, Calif., or from other manufactures. It is contemplated that other processing system, including those available from other manufacturers, may be adapted to practice the disclosure. It is noted that all these layers and film stack 710, 708, 706, 406, 704 in the magnetic tunnel junction (MTJ) 702 may be formed in one or more processing chambers incorporated in the cluster processing system 100, 200 depicted in FIGS. 1 and 2.

Accordingly, processes and apparatus of forming MTJ device structures for MRAM are provided, particularly for hybrid (or called integrated) spin-orbit-torque magnetic spin-transfer-torque magnetic random access memory (SOT-STT MRAM) applications. In one embodiment, while pattering a film stack for forming the MTJ structure, a hardmask may be utilized. Such hardmask layer may be the same material of a spin orbit torque (SOT) layer disposed on the MTJ structure. In some examples, the hardmask layer may also be served as the spin orbit torque (SOT) layer when the MTJ structure is patterned and formed. After the MTJ structure and the SOT layer is formed thereon, a back end (e.g., single damascene or dual damascene) interconnection structure may be formed on the SOT layer so that the back end interconnection structure is in electrical communication to the MTJ structure. Multiple back end structures and MTJ structures may be utilized to enhance the densities and electrical performance of the MRAM devices.

While the foregoing is directed to embodiments of the disclosure, other and further embodiments of the disclosure may be devised without departing from the basic scope thereof.

What is claimed is:

1. An interconnection structure comprising:
   at least three magnetic tunnel junction structures disposed on a substrate, a first magnetic tunnel junction structure of the at least three magnetic tunnel junction structures comprising:
   a first ferromagnetic layer;
   a second ferromagnetic layer disposed on and contacting a top surface of a first lower interconnection structure, wherein the first ferromagnetic layer and the second ferromagnetic layer sandwich a tunneling barrier layer; and
   a hardmask layer disposed on the first ferromagnetic layer;
   a spin orbit torque (SOT) layer having a bottommost surface disposed on and contacting a top surface of the hardmask layer, wherein the SOT layer is electrically conductive; and
   two or more back end structures disposed on the SOT layer, wherein a number of the two or more back end structures is less than a number of the at least three magnetic tunnel junction structures.

2. The interconnection structure of claim 1, wherein the hardmask layer is formed from a material that is the same as the SOT layer.

3. The interconnection structure of claim 2, wherein the material of the hardmask layer is CoFeB, MgO, Ta, W, Pt, CuBi, Mo and Ru.

4. The interconnection structure of claim 1, wherein at least one of the two or more back end structures is a dual damascene structure.

5. The interconnection structure of claim 1,
   wherein the first lower interconnection structure is formed under the first magnetic tunnel junction structure.

6. The interconnection structure of claim 1, wherein the SOT layer connects at least one of the two or more back end structures to the first lower interconnection structure through the first magnetic tunnel junction structure.

7. The interconnection structure of claim 1, wherein at least one of the two or more back end structures is connected to a second lower interconnection structure.

8. The interconnection structure of claim 1, wherein three of the at least three magnetic tunnel junction structures are connected to the SOT layer.

9. The interconnection structure of claim 1, wherein the first magnetic tunnel junction structure further comprises:
   a seed layer formed on a bottom of the first magnetic tunnel junction structure.

10. The interconnection structure of claim 1, wherein the hardmask layer is a capping layer.

11. The interconnection structure of claim 1, wherein a width of the SOT layer is larger than a width of the hardmask layer.

12. The interconnection structure of claim 1, wherein at least one of the two or more back end structures is disposed outside an edge of the first magnetic tunnel junction structure.

13. The interconnection structure of claim 1, wherein the SOT layer is configured to electrically couple at least one of the two or more back end structures with the first magnetic tunnel junction structure.

14. The interconnection structure of claim 7, wherein the first magnetic tunnel junction structure is disposed in a layer between the two or more back end structures and the second lower interconnection structure.

* * * * *